(12) United States Patent
Deak et al.

(10) Patent No.: US 11,169,225 B2
(45) Date of Patent: Nov. 9, 2021

(54) TMR HIGH-SENSITIVITY SINGLE-CHIP PUSH-PULL BRIDGE MAGNETIC FIELD SENSOR

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 315 days.

(21) Appl. No.: 15/773,368

(22) PCT Filed: Oct. 31, 2016

(86) PCT No.: PCT/CN2016/104000
§ 371 (c)(1),
(2) Date: May 3, 2018

(87) PCT Pub. No.: WO2017/076252
PCT Pub. Date: May 11, 2017

(65) Prior Publication Data
US 2018/0321334 A1  Nov. 8, 2018

(30) Foreign Application Priority Data
Nov. 3, 2015 (CN) .................. 201510736394.1

(51) Int. Cl.
*G01R 33/09* (2006.01)
*G01R 33/02* (2006.01)
*G01R 33/00* (2006.01)

(52) U.S. Cl.
CPC ........ *G01R 33/098* (2013.01); *G01R 33/0011* (2013.01); *G01R 33/02* (2013.01); *G01R 33/09* (2013.01); *G01R 33/093* (2013.01)

(58) Field of Classification Search
CPC ...... G01R 33/06; G01R 33/07; G01R 33/072; G01R 33/09; G01R 33/091; G01R 33/093;
(Continued)

(56) References Cited

U.S. PATENT DOCUMENTS 7,046,002 B1 * 5/2006 Edelstein ............... G01R 33/02
324/225
7,195,945 B1 * 3/2007 Edelstein ............... B82Y 25/00
324/244

(Continued)

FOREIGN PATENT DOCUMENTS

CN      2300108      12/1998
CN      103575960    2/2014
(Continued)

OTHER PUBLICATIONS

"International Application No. PCT/CN2016/104000, International Search Report and Written Opinion dated Feb. 4, 2017", (Feb. 4, 2017), 12 pgs.

(Continued)

*Primary Examiner* — David M Schindler
(74) *Attorney, Agent, or Firm* — Schwegman Lundberg & Woessner, P.A.

(57) ABSTRACT

A magnetic field sensor comprises a substrate and two comb-shaped soft ferromagnetic flux concentrators with an interdigitated structure formed on the substrate. The concentrators comprise N and N−1 rectangular comb teeth and corresponding comb seats wherein N is an integer greater than 1. Gaps are formed between the comb teeth of one concentrator and the comb seat of the other concentrator in an X direction. Adjacent comb teeth in a +Y direction form 2m−1 odd space gaps and 2m even space gaps. Here, m is an integer greater than zero and less than N. Push and pull magnetoresistive sensing element strings are located respec- (Continued)

tively in the odd space gaps and the even space gaps, and are electrically interconnected into a push-pull bridge. The magnetization alignment directions of the ferromagnetic pinned layer of the magnetic sensing element strings are Y direction.

15 Claims, 7 Drawing Sheets

(58) Field of Classification Search
CPC .. G01R 33/095; G01R 33/096; G01R 33/098; G01B 7/14; G01B 7/30; H01L 27/22; H01L 43/00; H01L 43/02; H01L 43/04; H01L 43/06; H01L 43/065; H01L 43/08
See application file for complete search history.

(56) References Cited

U.S. PATENT DOCUMENTS

| | | | |
|---|---|---|---|
| 2013/0141090 A1* | 6/2013 | Sidman | G01R 33/093 324/252 |
| 2014/0266185 A1* | 9/2014 | Sidman | G01R 33/0005 324/252 |
| 2015/0177337 A1* | 6/2015 | Yamashita | H01L 43/08 324/252 |
| 2016/0169982 A1* | 6/2016 | Deak | G01R 33/0011 324/252 |
| 2017/0268864 A1* | 9/2017 | Deak | G01R 33/0011 |
| 2018/0164386 A1* | 6/2018 | Deak | H01L 43/08 |

FOREIGN PATENT DOCUMENTS

| | | |
|---|---|---|
| CN | 103630855 | 3/2014 |
| CN | 103645449 | 3/2014 |
| CN | 103913709 | 7/2014 |
| CN | 204347226 | 5/2015 |
| CN | 104880682 | 9/2015 |
| CN | 204740335 | 11/2015 |
| CN | 105259518 | 1/2016 |
| CN | 205353331 | 6/2016 |
| GB | 1529967 | 10/1978 |
| WO | WO-2017076252 | 5/2017 |

OTHER PUBLICATIONS

"Chinese Application No. 201510736394.1, Chinese search report dated Jul. 5, 2017", (Jul. 5, 2017), 2 pgs.
"European Application No. 16861520.1, Letter in response to Communication dated Jun. 28, 2019", (Jan. 7, 2020), 31 pgs.

\* cited by examiner

TMR HIGH-SENSITIVITY SINGLE-CHIP PUSH-PULL BRIDGE MAGNETIC FIELD SENSOR

PRIORITY CLAIM TO RELATED APPLICATIONS

This application is a U.S. national stage application filed under 35 U.S.C. § 371 from International Application Serial No. PCT/CN2016/104000, which was filed 31 Oct. 2016, and published as WO2017/076252 on 11 May 2017, and which claims priority to Chinese Application No. 201510736394.1, filed 3 Nov. 2015, which applications and publication are incorporated by reference as if reproduced herein and made a part hereof in their entirety, and the benefit of priority of each of which is claimed herein.

TECHNICAL FIELD

The present invention relates to the field of magnetic sensors, and in particular, to a TMR high-sensitivity single-chip push-pull bridge magnetic field sensor.

BACKGROUND ART

There are two major difficulties in manufacturing a TMR high-sensitivity single-chip linear magnetic field sensor: first, a push-pull bridge linear magnetoresistive sensor requires the pinned layer of the push magnetoresistive sensing elements within the push arm and the pinned layer of the pull magnetoresistive sensing elements within the pull arm to have opposite directions; second, referenced bridge linear magnetoresistive sensors require reference magnetoresistive sensing elements within a reference arm to be magnetically shielded. The following key problems result:

(1). For the push-pull bridge magnetoresistive sensor, a new technique that can locally program and magnetize magnetization alignment directions of a pinned layer of magnetoresistive sensing elements needs to be developed. It is expensive to develop this technique, and the reliability of the technique of locally programming the magnetization alignment directions of the pinned layer of the magnetoresistive sensing elements is unknown.

(2). The referenced bridge magnetoresistive sensor is inferior because it only has half the sensitivity of a push-pull bridge, and the output linearity of the referenced bridge magnetoresistive sensor is poor.

SUMMARY OF THE INVENTION

To overcome the above problems, the present invention develops utilizes a flux concentrator, with a long interdigitated structure to provide high field gain of an external magnetic field. Additionally the flux concentrators and nearby TMR magnetoresistive sensing elements are arranged alternately with each other to generate a push-pull magnetic field profile onto the magnetoresistive sensing elements. The present invention enables a single-chip linear magnetoresistive device to have a high magnetic field sensitivity and good linearity.

The present invention proposes a new design solution of a Y-axis magnetoresistive sensor. Interdigitated soft ferromagnetic flux concentrators are used to implement conversion of an X magnetic field into a −Y magnetic field and a +Y magnetic field that have identical sizes and opposite directions in interdigitated gaps, while magnetoresistive sensing elements in the gaps have identical magnetic multi-layer film structures and Y-axis sensitive directions, thus implementing the preparation of a push-pull Y-axis magnetoresistive sensor. Moreover, the interdigitated soft ferromagnetic flux concentrators can further amplify the magnitude of the magnetic field, thus providing a high-sensitivity push-pull magnetoresistive sensor.

The TMR high-sensitivity single-chip push-pull bridge magnetic field sensor proposed in the present invention includes a substrate, and two comb-shaped soft ferromagnetic flux concentrators located on the substrate. One comb-shaped soft ferromagnetic flux concentrator includes a comb seat and N rectangular comb teeth with length×width being Lx×Ly, and the other comb-shaped soft ferromagnetic flux concentrator includes a comb seat and N−1 rectangular comb teeth with length×width being Lx×Ly, wherein N is an integer greater than 1. The comb teeth of the two comb-shaped soft ferromagnetic flux concentrators are interdigitated to form an interdigitated structure. Gaps are formed between the comb teeth of one comb-shaped soft ferromagnetic flux concentrator and the comb seat of the other comb-shaped soft ferromagnetic flux concentrator in an X direction. The length of the gap is Lgx. Adjacent comb teeth form space gaps which are divided into 2m−1 odd space gaps and 2m even space gaps respectively formed in a +Y direction. The length of the space gap is Lsx, the width of the space gap is Lsy, and m is an integer greater than zero and less than N.

The TMR high-sensitivity single-chip push-pull bridge magnetic field sensor further includes push magnetoresistive sensing element strings and pull magnetoresistive sensing element strings. The push magnetoresistive sensing element strings and the pull magnetoresistive sensing element strings are located respectively in the odd space gaps and the even space gaps and are parallel to the X direction. The push magnetoresistive sensing element strings and the pull magnetoresistive sensing element strings are located respectively in the odd space gaps and the even space gaps and are parallel to the X direction. The push magnetoresistive sensing element strings are electrically interconnected into a push arm, the pull magnetoresistive sensing element strings are electrically interconnected into a pull arm, and the push arm and the pull arm are electrically interconnected into a push-pull magnetoresistive sensor bridge. The push magnetoresistive sensing element string includes multiple push magnetoresistive sensing elements, and the pull magnetoresistive sensing element string includes multiple pull magnetoresistive sensing elements. The magnetization alignment directions of the ferromagnetic pinned layers of the push magnetoresistive sensing elements and pull magnetoresistive sensing elements are +Y or −Y direction. A magnetic field gain coefficient ANS between the external magnetic field $B_{(x\text{-}ext)}$ in the X or −X direction and a $B_y$ magnetic-field component in the gaps in the Y or −Y direction is given as to $B_y/B_{(x\text{-}ext)}$, and it is greater than 1.

The comb seat is rectangular and has a length Lex and a width Ley.

The TMR high-sensitivity single-chip push-pull bridge magnetic field sensor further includes two rectangular soft ferromagnetic flux concentrators. The rectangular soft ferromagnetic flux concentrators have lengths and widths respectively parallel to the X direction and the Y direction and are respectively placed at two positions with identical distances from a +Y end and a −Y end of the interdigitated structure.

The comb seat is in a shape of a bottle plug including a rectangle and a trapezoid, wherein a short base of the trapezoid is connected to the comb teeth, and a long base of the trapezoid is a common edge of the trapezoid and the rectangle.

The total number of the odd space gaps and the even space gaps where the push magnetoresistive sensing element strings and the pull magnetoresistive sensing element strings are located is 2N+1, that is, for any push magnetoresistive sensing element string numbered 2m−1, there exists a pull magnetoresistive sensing element string numbered 2(N−m+1); and for any pull magnetoresistive sensing element string numbered 2m, there exists a push magnetoresistive sensing element string numbered 2(N−m)+1. The magnetic field gain coefficient ANS is increased by increasing the width Ly of the comb teeth or reducing the width Lsy of the space gap.

The magnetic field gain coefficient ANS is increased by reducing the length Lsx of the space gap or increasing the length Lgx of the gap.

The magnetic field gain coefficient ANS is increased by increasing the length-width ratio of the comb seat, increasing Lex, reducing Ley, or reducing the number N of the comb teeth.

The width Ly of the comb teeth ranges from 20 μm to 200 μm, and the width Lsy of the space gap ranges from 6 μm to 200 μm.

The length Lsx of the space gap ranges from 10 μm to 200 μm, and the length Lgx of the gap ranges from 20 μm to 500 μm.

The length Lex ranges from 20 μm to 2000 μm, and a range of the number N of the comb teeth is 2≤N≤10.

The push magnetoresistive sensing elements and the pull magnetoresistive sensing elements are TMR sensing elements, with directions of pinned layers being parallel to the Y-axis direction and directions of free layers being parallel to the X-axis direction.

In the absence of an external magnetic field, the push magnetoresistive sensing elements and the pull magnetoresistive sensing elements enable the magnetization alignment direction of a ferromagnetic free layer to be perpendicular to the magnetization alignment direction of a ferromagnetic pinned layer by means of permanent-magnet bias, double exchange, shape anisotropy, or any combination thereof.

The push-pull magnetoresistive sensor bridge is a half-bridge, a full-bridge, or a quasi-bridge.

The number of the push magnetoresistive sensing elements on the push arm and the number of the pull magnetoresistive sensing elements on the pull arm are the same.

The material of the comb-shaped soft ferromagnetic flux concentrator is a soft magnetic alloy containing one or more of elements Fe, Ni, and Co.

The material of the substrate is glass or a silicon wafer, and an ASIC integrated circuit is provided on the substrate. The ASIC integrated circuit is a CMOS, a BiCMOS, a Bipolar, a BCDMOS, or an SOI.

The material of the substrate is glass or a silicon wafer, and the substrate is connected to an ASIC chip. The ASIC chip includes one or more of the following application circuits: an offset circuit, a gain circuit, a calibration circuit, a temperature compensation circuit, and a logic circuit. The logic circuit is a digital switching circuit or a rotating angle calculation circuit.

Based on the above technical solution, the present invention has the following beneficial effects:

The present invention adopts soft ferromagnetic flux concentrators with an interdigitated structure and alternately arranges TMR magnetoresistive sensing elements in gaps of the interdigitated structure, such that the TMR single-chip push-pull bridge magnetic field sensor has high magnetic field sensitivity and good linearity. The present invention further has advantages of a simple structure and low power consumption.

DETAILED DESCRIPTION

The present invention will be described in detail through embodiments with reference to the accompanying drawings.

Embodiment 1

Figure 1:
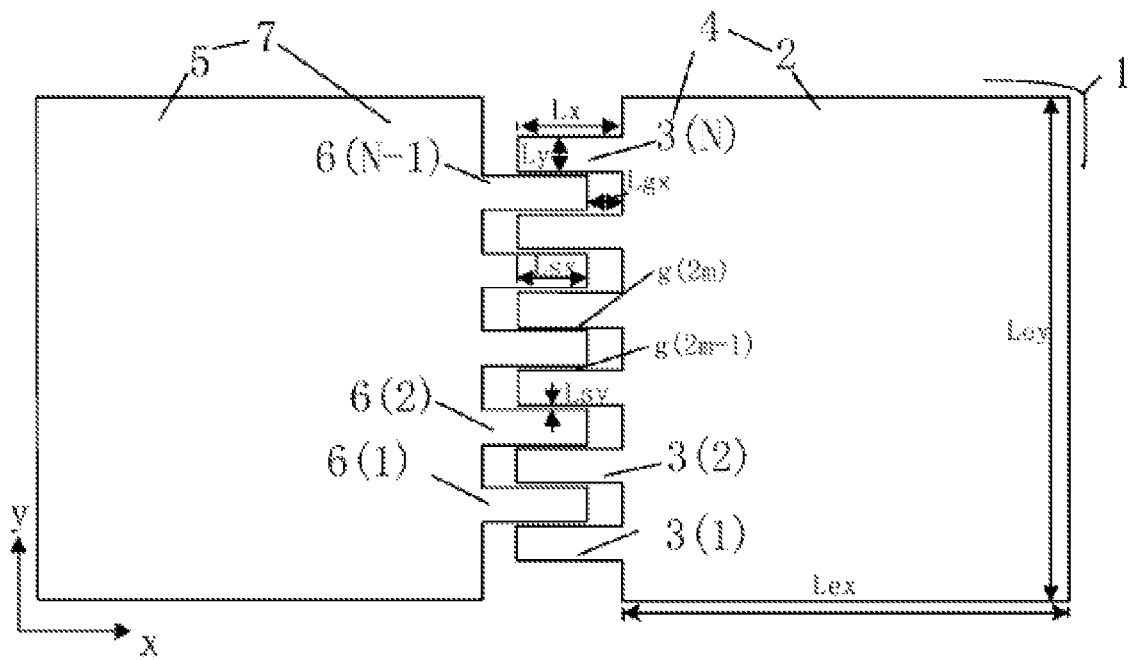
FIG. 1 shows a first structure of soft ferromagnetic flux concentrators with an interdigitated structure.

FIG. 1 is a first structure 1 of soft ferromagnetic flux concentrators with an interdigitated structure, including two comb-shaped soft ferromagnetic flux concentrators 4 and 7. The comb-shaped soft ferromagnetic flux concentrator 4 includes a comb seat 2 and N rectangular comb teeth 3(i), i being an integer from 1 to N. The comb-shaped soft ferromagnetic flux concentrator 7 includes a comb seat 5 and N−1 rectangular comb teeth 6(j), j being an integer from 1 to N−1. Each of the rectangular comb teeth 3(i) and 6(j) has a length Lx and a width Ly. In this structure 1, the comb seats 2 and 5 are both rectangular, and each have a length Lex and a width Ley. The comb teeth of the comb-shaped soft ferromagnetic flux concentrators 4 and 7 are interdigitated to form an interdigitated structure, wherein a gap with a length Lgx is formed along an X direction between any rectangular comb tooth 3(i) and the comb seat 5 and between any rectangular comb tooth 6(j) and the comb seat 2. Adjacent comb teeth 3(i) and 6(j) form space gaps, and the space gaps are divided into 2m−1 odd space gaps g(2m−1) and 2m even space gaps g(2m) which are alternately formed in a +Y direction. The odd space gaps and the even space gaps each have a length Lsx and a width Lsy, and m is an integer greater than zero and less than N.

Figure 2:
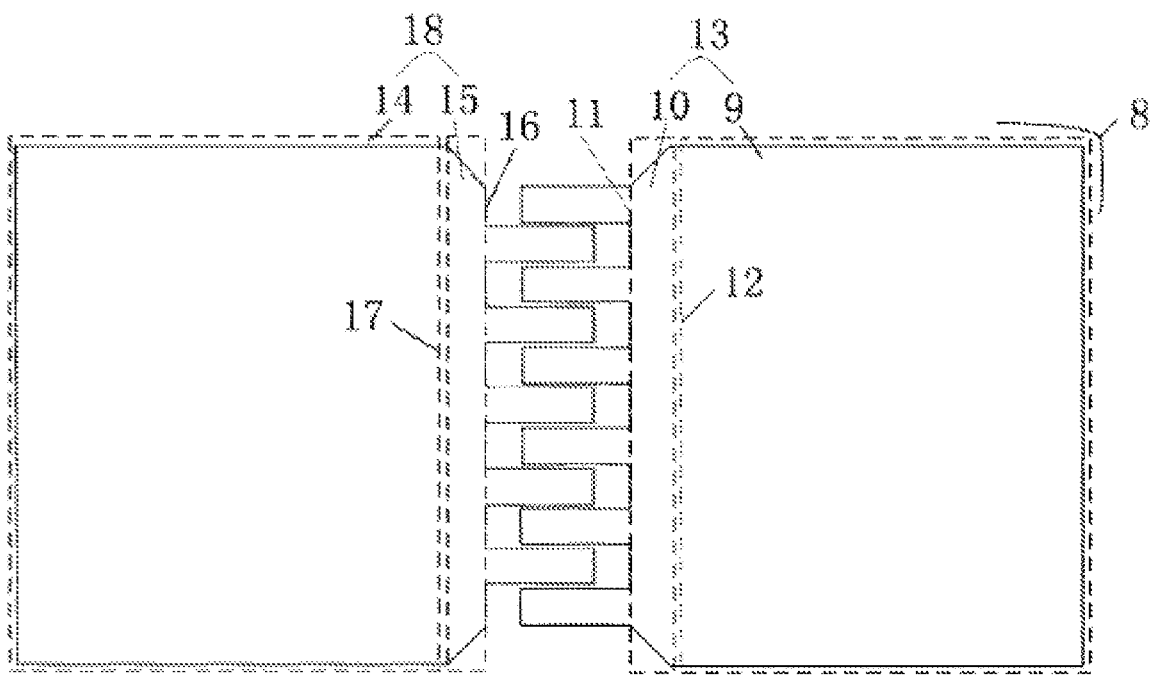
FIG. 2 shows a second structure of soft ferromagnetic flux concentrators with an interdigitated structure.

FIG. 2 is a second structure 8 of soft ferromagnetic flux concentrators with an interdigitated structure, which differs from the first structure 1 of the soft ferromagnetic flux concentrators with an interdigitated structure in that, comb seats 13 and 18 are bottle plug-shaped. The comb seat 13 includes a rectangle 9 and a trapezoid 10. A short base 11 of the trapezoid 10 is connected to the comb teeth, and a long base 12 is connected to the rectangle 9. The comb seat 18 includes a rectangle 14 and a trapezoid 15. A short base 16 of the trapezoid 15 is connected to the comb teeth, and a long base 17 is connected to the rectangle 14.

Figure 3:
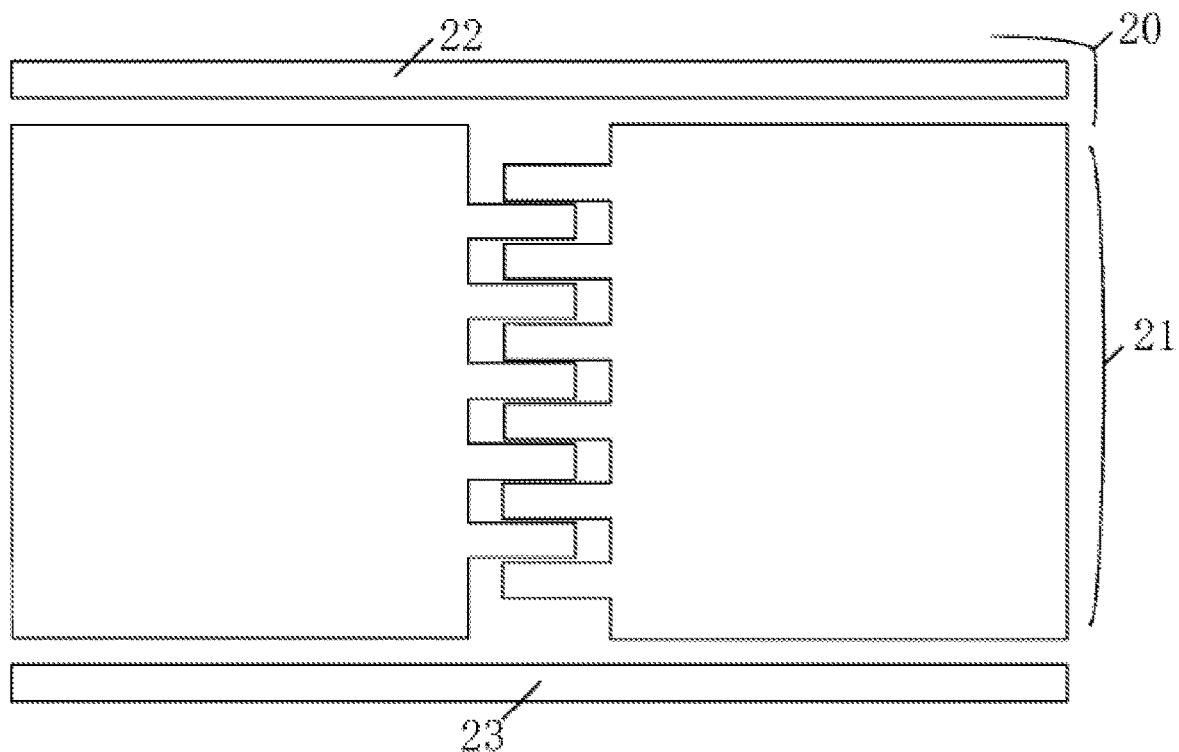
FIG. 3 shows a third structure of soft ferromagnetic flux concentrators with an interdigitated structure.

FIG. 3 is a third structure 20 of soft ferromagnetic flux concentrators with an interdigitated structure. The difference lies in that elongated soft ferromagnetic flux concentrators 22 and 23 are respectively added at a +Y end and a −Y end of an interdigitated soft ferromagnetic flux concentrator structure 21. A distance from the soft ferromagnetic flux concentrator 22 to the +Y end of the interdigitated soft ferromagnetic flux concentrator structure 21 is identical to a distance from the soft ferromagnetic flux concentrator 23 to the −Y end of the interdigitated soft ferromagnetic flux concentrator structure 21. The interdigitated soft ferromagnetic flux concentrator structure 21 may be the first structure 1 of the soft ferromagnetic flux concentrators with an interdigitated structure or the second structure 8 of the soft ferromagnetic flux concentrators with an interdigitated structure.

Figure 4:
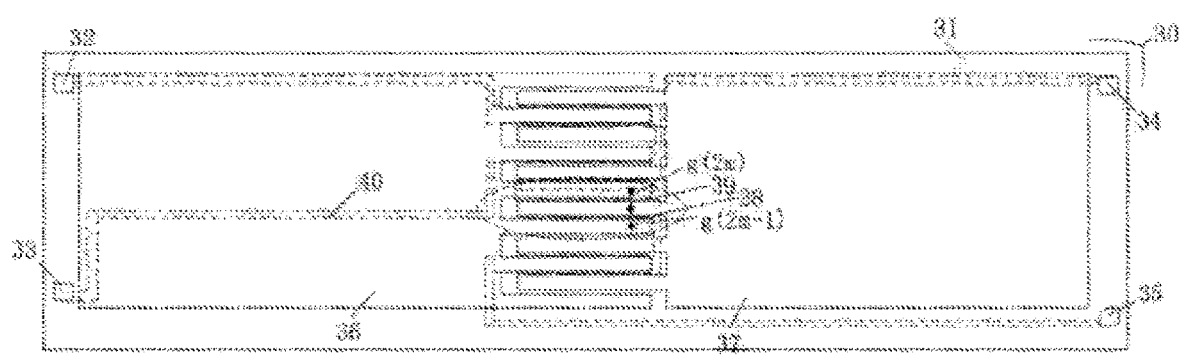
FIG. 4 is a structural diagram of a high-sensitivity push-pull magnetoresistive sensor.

FIG. 4 is a structural diagram 30 of a high-sensitivity push-pull magnetoresistive sensor, including a substrate 31, two comb-shaped soft ferromagnetic flux concentrators 36 and 37 with an interdigitated structure formed on the substrate 31, push magnetoresistive sensing element strings 38, and pull magnetoresistive sensing element strings 39. Comb teeth of the comb-shaped soft ferromagnetic flux concentrators 36 and 37 are interdigitated, and alternately form odd space gaps g(2m−1) and even space gaps g(2m) in a +Y direction. The push magnetoresistive sensing element strings 38 are located in the odd space gaps g(2m−1) and the pull magnetoresistive sensing element strings 39 are located in the even space gaps g(2m). The push magnetoresistive sensing element strings 38 are electrically interconnected into a push arm, the pull magnetoresistive sensing element strings 39 are electrically interconnected into a pull arm, and the push arm and the pull arm are electrically interconnected by a wire 40 to form a bridge structure. The bridge structure is connected to a power source 32, a ground electrode 35, and output signal electrodes 33 and 34.

Figure 5:
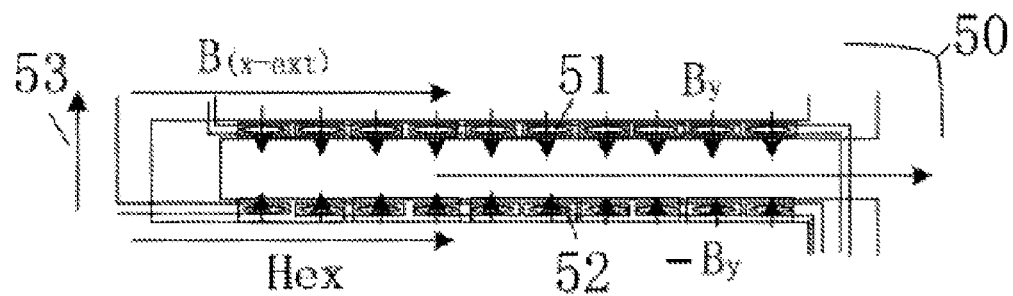
FIG. 5 is a distribution diagram of push and pull magnetoresistive sensing element strings in soft ferromagnetic flux concentrators with an interdigitated structure.

FIG. 5 is a distribution diagram of push magnetoresistive sensing element strings and pull magnetoresistive sensing element strings in gaps of an interdigitated structure, actually corresponding to an oval region in FIG. 4. After an external magnetic field $B_{(x\text{-}ext)}$ passes through the soft ferromagnetic flux concentrators, a $B_y$ magnetic-field component and a $-B_y$ magnetic-field component are generated in gaps 51 and gaps 52 respectively and are applied to the push magnetoresistive sensing element strings and the pull magnetoresistive sensing element strings respectively. A corresponding magnetic field gain factor is ANS=$B_y/B_{(x\text{-}ext)}$, wherein the push magnetoresistive sensing elements and the pull magnetoresistive sensing elements have the same magnetic field sensitivity direction 53, i.e., the +Y or −Y direction. In addition, to ensure that the push-pull magnetoresistive sensor has higher magnetic field sensitivity, the ANS is required to be greater than 1, that is, the external magnetic field can be amplified.

The material of the comb-shaped soft ferromagnetic flux concentrator is a soft magnetic alloy containing one or more of elements Fe, Ni, and Co.

The material of the substrate is glass or a silicon wafer, and an ASIC integrated circuit is provided on the substrate. The ASIC integrated circuit is a CMOS, a BiCMOS, a Bipolar, a BCDMOS, or an SOI. Or, the substrate is connected to an ASIC chip. The ASIC chip includes one or more of the following application circuits: an offset circuit, a gain circuit, a calibration circuit, a temperature compensation circuit, and a logic circuit. The logic circuit is a digital switching circuit or a rotating angle calculation circuit.

Figure 6:
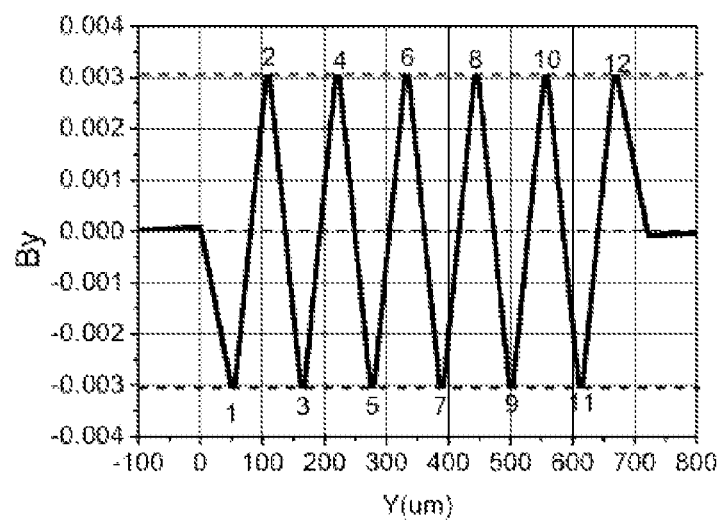
FIG. 6 is a distribution diagram of a Y magnetic field in gaps of soft ferromagnetic flux concentrators with an interdigitated structure under the effect of an X external magnetic field.

FIG. 6 is a diagram of changes of Y magnetic field components in odd space gaps and even space gaps of soft ferromagnetic flux concentrators with an interdigitated structure under the effect of an X magnetic field. As can be seen, the Y magnetic field components in the odd space gaps and the even space gaps have opposite magnetic field directions and identical amplitudes.

Figure 7:
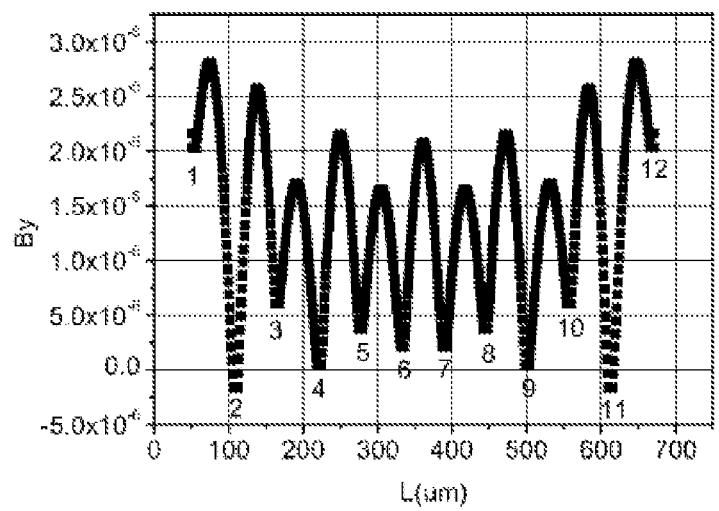
FIG. 7 is a distribution diagram of a Y magnetic field in gaps of soft ferromagnetic flux concentrators with an interdigitated structure under the effect of a Y external magnetic field.

FIG. 7 is a diagram of changes of Y magnetic field components in odd space gaps and even space gaps of soft ferromagnetic flux concentrators with an interdigitated structure under the effect of a Y magnetic field. As can be seen, the Y magnetic field components in the odd space gaps and the even space gaps have inconsistent amplitudes. The Y magnetic field components in space gaps numbered from 1 to N are centrally symmetric, that is, two space gaps whose numbers total 1+N have identical Y magnetic field components. Therefore, when push magnetoresistive sensing element strings and pull magnetoresistive sensing element strings included in a push-pull magnetoresistive sensor are constructed, in order to ensure that a push arm and a pull arm have identical resistances to generate 0 signal output when the push magnetoresistive sensing element strings and the pull magnetoresistive sensing element strings are under the effect of the Y magnetic field, the push magnetoresistive sensing element strings and the pull magnetoresistive sensing element strings need to be alternately located in the odd space gaps and the even space gaps, and moreover, distribution of the magnetoresistive sensing element strings should meet the following condition: for any push magnetoresistive sensing element string numbered 2m−1, a pull magnetoresistive sensing element string numbered 2(N−m+1) should exist, and for any pull magnetoresistive sensing element string numbered 2m, a push magnetoresistive sensing element string numbered 2(N−m)+1 should exist, wherein m is an integer greater than zero and less than N.

Figure 8:
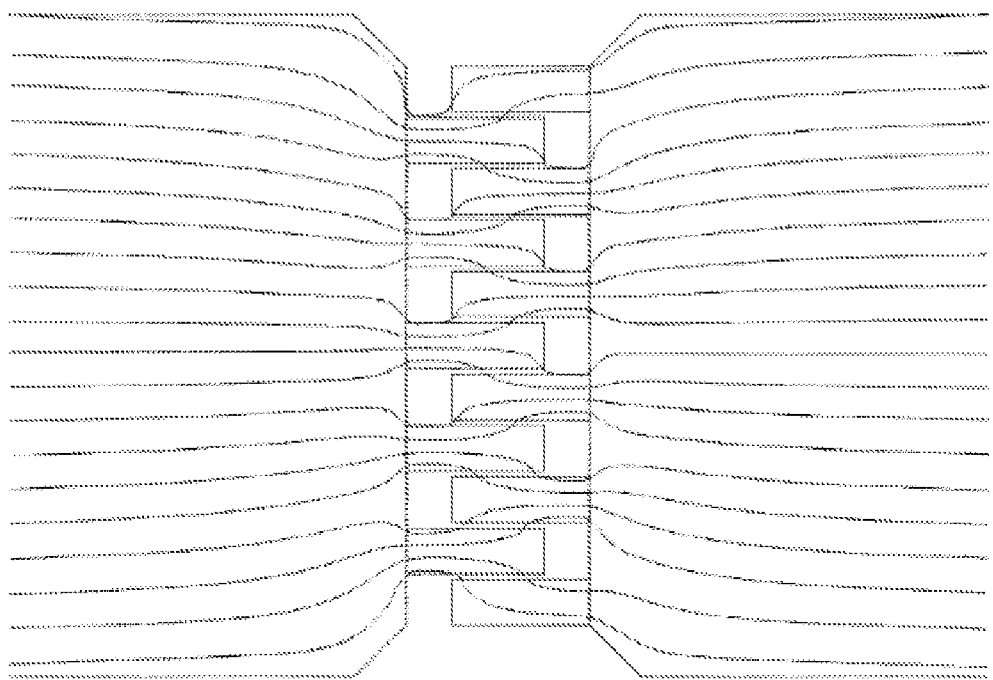
FIG. 8 is a distribution diagram of magnetic lines of force of soft ferromagnetic flux concentrators with an interdigitated structure, comb seats of the soft ferromagnetic flux concentrators being bottle plug-shaped.
Figure 9:
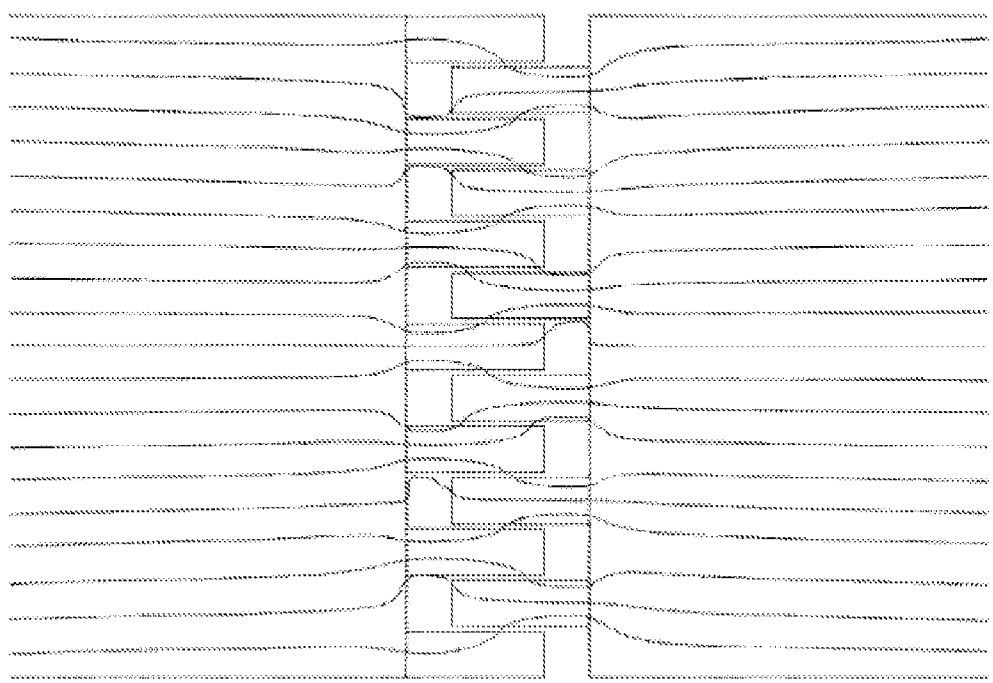
FIG. 9 is a distribution diagram of magnetic lines of force of soft ferromagnetic flux concentrators with an interdigitated structure, comb seats of the soft ferromagnetic flux concentrators being rectangular.

FIG. 8 is a distribution diagram of magnetic lines of force of soft ferromagnetic flux concentrators with an interdigitated structure, comb seats of the soft ferromagnetic flux concentrators being bottle plug-shaped. FIG. 9 is a distribution diagram of magnetic lines of force of soft ferromagnetic flux concentrators with an interdigitated structure, comb seats of the soft ferromagnetic flux concentrators being rectangular. As can be seen through comparison, the bottle plug-shaped comb seat structure can concentrate the magnetic lines of force in space gaps more efficiently than the rectangular comb seat structure, thus having a higher magnetic field gain.

FIG. 10 to FIG. 14 respectively show that a gain factor of a push-pull magnetoresistive sensor changes with geometric design parameters of soft ferromagnetic flux concentrators with an interdigitated structure, to ensure that a high magnetic field gain factor can be obtained. In the figures, "−" before scales indicates a reverse direction.

Figure 10:
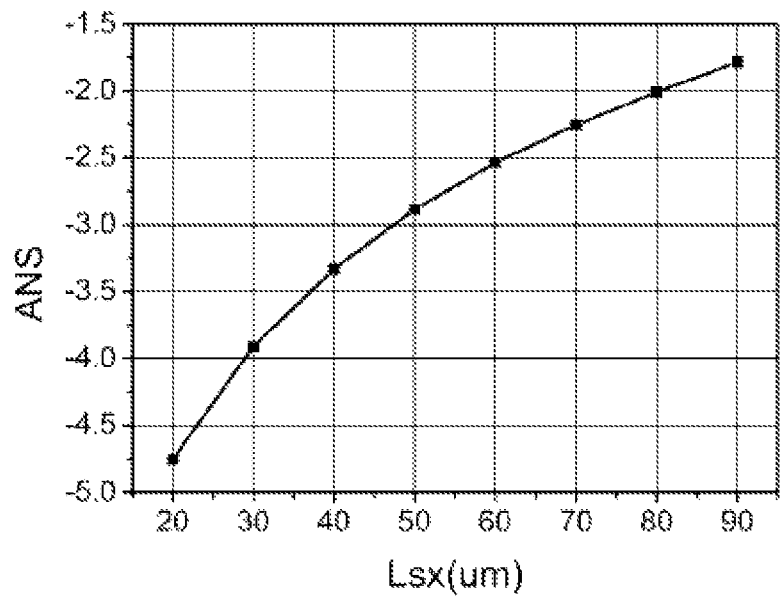
FIG. 10 shows that a magnetic field gain factor changes with the length Lsx of space gaps in soft ferromagnetic flux concentrators with an interdigitated structure.

FIG. 10 represents changes in a magnetic field gain factor along with the length of space gaps. As can be seen, the magnetic field gain factor will be increased when the length Lsx of the space gaps is reduced.

Figure 11:
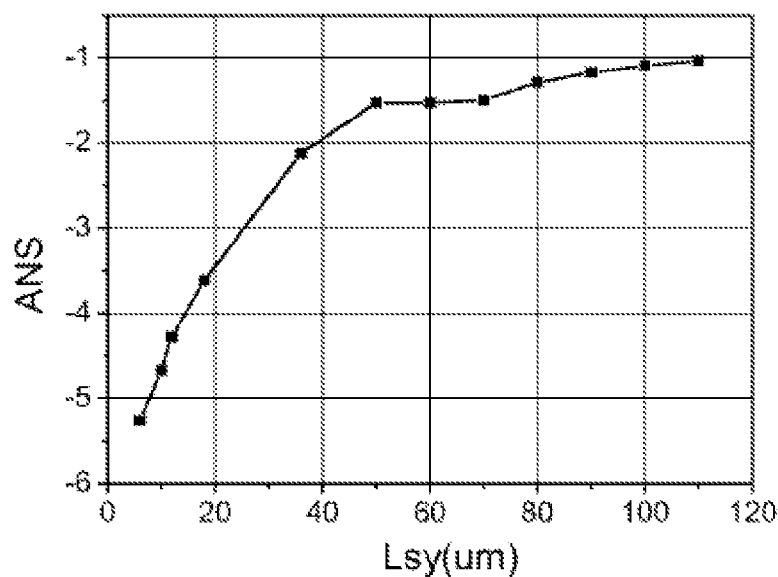
FIG. 11 shows that a magnetic field gain factor changes with the width Lsx of space gaps in soft ferromagnetic flux concentrators with an interdigitated structure.

FIG. 11 represents changes in a magnetic field gain factor along with the width of space gaps. As can be seen, the magnetic field gain factor will be increased when the width Lsy of the space gaps is reduced.

Figure 12:
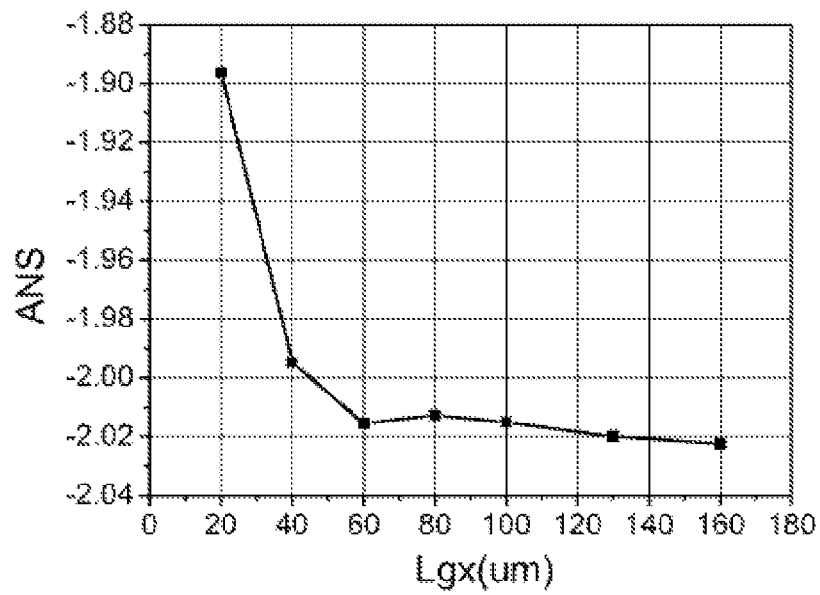
FIG. 12 shows that a magnetic field gain factor changes with the width Lgx of gaps in soft ferromagnetic flux concentrators with an interdigitated structure.

FIG. 12 represents changes in a magnetic field gain factor along with the length of gaps. As can be seen, the magnetic field gain factor will be increased when the length Lgx of the gaps is increased. However, the increasing effect is slight after the length Lgx of the gaps is greater than 60 μm.

Figure 13:
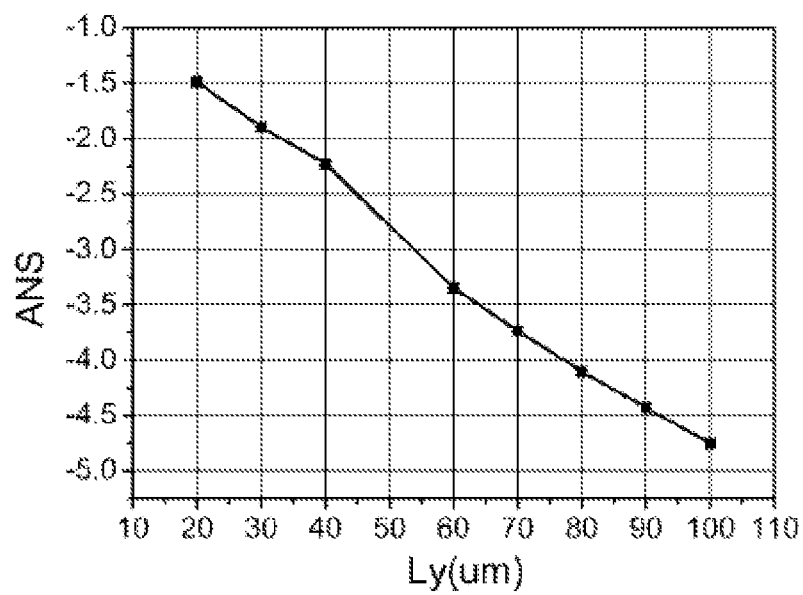
FIG. 13 shows that a magnetic field gain factor changes with the width Ly of comb teeth in soft ferromagnetic flux concentrators with an interdigitated structure.

FIG. 13 represents changes in a magnetic field gain factor along with the width Ly of comb teeth. As can be seen, the magnetic field gain factor will be greatly increased when the width Ly of comb teeth is increased.

Figure 14:
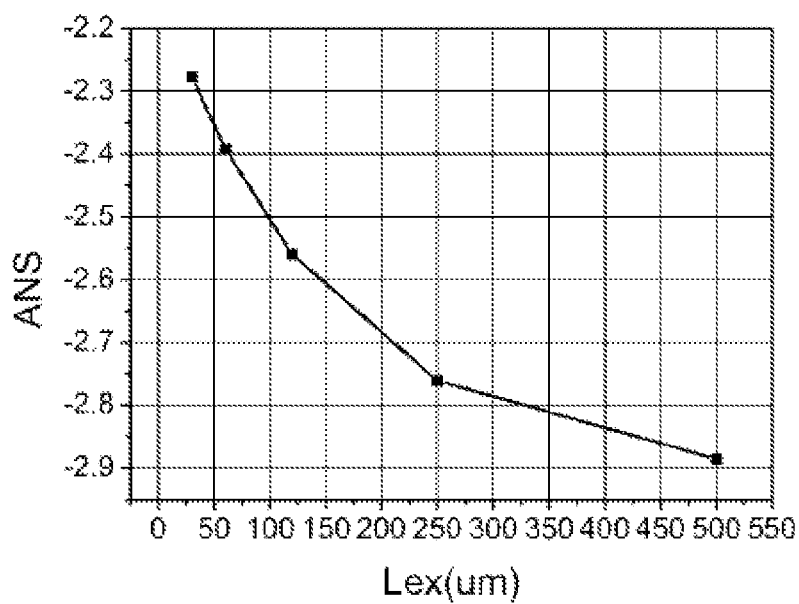
FIG. 14 shows that a magnetic field gain factor changes with the length Lex of comb seats in soft ferromagnetic flux concentrators with an interdigitated structure.

FIG. 14 represents changes in a magnetic field gain factor along with the length Lex of comb seats. As can be seen, the magnetic field gain factor will be increased when the length Lex of comb teeth is increased.

According to calculation results, in order to obtain a high-sensitivity push-pull magnetoresistive sensor, soft ferromagnetic flux guiders with an interdigitated structure meet the following design requirements: the width Ly of the comb teeth ranges from 20 μm to 200 μm, and the width Lsy of the space gap ranges from 6 μm to 200 μm; the length Lsx of the space gap ranges from 10 μm to 200 μm, and the length Lgx of the gap ranges from 20 μm to 500 μm; the length Lex of the comb seat ranges from 20 μm to 2000 μm, and a range of the number N of the comb teeth is 2≤N≤10.

The above descriptions are merely preferred embodiments of the present invention and are not intended to limit the present invention. For those skilled in the art, the present invention may have various modifications and changes. The implementations in the present invention may also be combined and changed in different ways, and any modification, equivalent replacement, improvement, and so on within the spirit and principle of the present invention shall be covered in the protection scope of the present invention.

The invention claimed is:

1. A TMR high-sensitivity single-chip push-pull bridge magnetic field sensor, comprising:
   a substrate having a surface in an X-Y plane defined by an X-axis and a Y-axis;
   a first comb-shaped soft ferromagnetic flux concentrator and a second comb-shaped soft ferromagnetic flux concentrator located on the substrate,
   wherein the first comb-shaped soft ferromagnetic flux concentrator comprises a comb seat and N rectangular comb teeth, and the second comb-shaped soft ferromagnetic flux concentrator comprises a comb seat and N−1 rectangular comb teeth, N being an integer greater than 1, wherein the comb teeth of the first and second comb-shaped soft ferromagnetic flux concentrators have equal lengths in positive or negative X directions parallel to the X-axis and equal widths in positive or negative Y directions parallel to the Y-axis,
   wherein the comb teeth of the first and second comb-shaped soft ferromagnetic flux concentrators are interdigitated to form an interdigitated structure to form a first set of gaps in the negative Y direction from each of the comb teeth in the second comb-shaped soft ferromagnetic flux concentrator to a corresponding adjacent one of the comb teeth in the first comb-shaped soft ferromagnetic flux concentrator, and to form a second set of gaps in the positive Y direction from each of the comb teeth in the second comb-shaped soft ferromagnetic flux concentrator to a corresponding adjacent one of the comb teeth in the first comb-shaped soft ferromagnetic flux concentrator, and wherein each of the comb seats for the first and second comb-shaped soft ferromagnetic flux concentrators is in a shape of a bottle plug comprising a rectangle and a trapezoid, a short base of the respective trapezoid is in direct physical contact with the comb teeth, and a long base of the respective trapezoid is a common edge of the respective trapezoid and the respective rectangle, the long base having a length longer than the short base; and
   push magnetoresistive sensing element strings and pull magnetoresistive sensing element strings;
   wherein the push magnetoresistive sensing element strings are located in one of the first set of gaps or the second set of gaps and the pull magnetoresistive sensing element strings are located in the other one of the first set of gaps or the second set of gaps, wherein each of the push magnetoresistive sensing element strings and the pull magnetoresistive sensing element strings extend in the X direction;
   wherein the push magnetoresistive sensing element strings are electrically interconnected into a push arm, the pull magnetoresistive sensing element strings are electrically interconnected into a pull arm, and the push arm and the pull arm are electrically interconnected into a push-pull magnetoresistive sensor bridge;
   wherein each of the push magnetoresistive sensing element strings comprises multiple push magnetoresistive sensing elements, and each of the pull magnetoresistive sensing element strings comprises multiple pull magnetoresistive sensing elements;
   wherein magnetization alignment directions of ferromagnetic pinned layers of the push magnetoresistive sensing elements and pull magnetoresistive sensing elements are in a same direction parallel to the Y-axis in either the positive Y direction or the negative Y direction; and
   wherein the first and second comb-shaped soft ferromagnetic flux concentrators in the shape of the bottle-plug improves sensitivity of the push-pull magnetic field bridge sensor by increasing a magnetic field gain at the push and pull magnetoresistive sensing elements, wherein a magnetic field gain coefficient between an external magnetic field $B_{(x\text{-}ext)}$ in a positive X direction or a negative X direction and a $B_y$ magnetic-field component in the first and the second sets of gaps in the positive Y direction or the negative Y direction is given as to $B_y/B_{(x\text{-}ext)}$, and it is greater than 1.

2. The TMR high-sensitivity single-chip push-pull bridge magnetic field sensor according to claim 1, further comprising two rectangular soft ferromagnetic flux concentrators, wherein the rectangular soft ferromagnetic flux concentrators have lengths and widths respectively parallel to the positive or the negative X directions and the positive or the negative Y directions, and are respectively placed at two positions with identical distances from a +Y end and a −Y end of the interdigitated structure.

3. The TMR high-sensitivity single-chip push-pull bridge magnetic field sensor according to claim 1, wherein the comb teeth have a width in the positive Y direction or the negative Y direction within a range from 20 μm to 200 μm, wherein the first set of gaps in the negative Y direction and the second set of gaps in the positive Y direction have widths in the positive Y direction or the negative Y direction within a range from 6 μm to 200 μm.

4. The TMR high-sensitivity single-chip push-pull bridge magnetic field sensor according to claim 1, wherein the interdigitated structure has comb-teeth from the first comb-shaped soft ferromagnetic flux concentrator that are adjacent to comb-teeth from the second comb-shaped soft ferromagnetic flux concentrator for a length Lsx in the positive X direction or the negative X direction within a range from 10 μm to 200 μm, and a distance Lgx in the positive X direction or the negative X direction between the comb-teeth of one of the first or second comb-shaped soft ferromagnetic flux concentrators and the comb seat of the other of the first or second comb-shaped soft ferromagnetic flux concentrators is within a range from 20 μm to 500 μm.

5. The TMR high-sensitivity single-chip push-pull bridge magnetic field sensor according to claim 1, wherein the length of the comb seat ranges from 20 μm to 2000 μm, and the number N of the comb teeth is within a range $2 \leq N \leq 10$.

6. The TMR high-sensitivity single-chip push-pull bridge magnetic field sensor according to claim 1, wherein the push magnetoresistive sensing elements and the pull magnetoresistive sensing elements are TMR sensing elements.

7. The TMR high-sensitivity single-chip push-pull bridge magnetic field sensor according to claim 1, wherein the magnetic field sensor is configured with a permanent-magnet bias, a double exchange, a shape anisotropy or any combination thereof.

8. The TMR high-sensitivity single-chip push-pull bridge magnetic field sensor according to claim 1, wherein the push-pull magnetoresistive sensor bridge is a half-bridge.

9. The TMR high-sensitivity single-chip push-pull bridge magnetic field sensor according to claim 1, wherein a number of the push magnetoresistive sensing elements on the push arm and a number of the pull magnetoresistive sensing elements on the pull arm are the same.

10. The TMR high-sensitivity single-chip push-pull bridge magnetic field sensor according to claim 1, wherein a material of the first comb-shaped soft ferromagnetic flux concentrator and the second comb-shaped soft ferromagnetic flux concentrator is a soft magnetic alloy containing one or more of elements selected from the group of elements consisting of Fe, Ni, and Co.

11. The TMR high-sensitivity single-chip push-pull bridge magnetic field sensor according to claim 1, wherein a material of the substrate is glass or a silicon wafer, and an ASIC integrated circuit is provided on the substrate.

12. The TMR high-sensitivity single-chip push-pull bridge magnetic field sensor according to claim 1, wherein a material of the substrate is glass or a silicon wafer, and the substrate is connected to an ASIC chip.

13. The TMR high-sensitivity single-chip push-pull bridge magnetic field sensor according to claim 11, wherein the ASIC integrated circuit is a CMOS, a BiCMOS, a Bipolar, a BCDMOS, or an SOI.

14. The TMR high-sensitivity single-chip push-pull bridge magnetic field sensor according to claim 12, wherein the ASIC chip comprises one or more application circuits selected from a group of application circuits consisting of: an offset circuit, a gain circuit, a calibration circuit, a temperature compensation circuit, and a logic circuit.

15. The TMR high-sensitivity single-chip push-pull bridge magnetic field sensor according to claim 14, wherein the logic circuit is a digital switching circuit or a rotating angle calculation circuit.

* * * * *